United States Patent
Stechemesser

(10) Patent No.: US 9,651,601 B2
(45) Date of Patent: May 16, 2017

(54) CIRCUIT ARRANGEMENT FOR CABLE CHECKING, CABLE TESTING, CABLE DIAGNOSIS AND/OR CABLE FAULT LOCALIZATION AND DEVICE WITH A CIRCUIT ARRANGEMENT OF THAT TYPE

(71) Applicant: Hagenuk KMT Kabelmesstechnik GmbH, Radeburg (DE)

(72) Inventor: Nico Stechemesser, Dresden (DE)

(73) Assignee: Hagenuk KMT Kabelmesstechnik GmbH, Radeburg (DE)

( * ) Notice: Subject to any disclaimer, the term of this patent is extended or adjusted under 35 U.S.C. 154(b) by 0 days.

(21) Appl. No.: 15/017,595

(22) Filed: Feb. 6, 2016

(65) Prior Publication Data

US 2016/0238648 A1 Aug. 18, 2016

(30) Foreign Application Priority Data

Feb. 12, 2015 (DE) .................. 10 2015 202 597

(51) Int. Cl.
*G01R 31/02* (2006.01)
*G01R 31/14* (2006.01)
(Continued)

(52) U.S. Cl.
CPC .......... *G01R 31/021* (2013.01); *G01R 31/14* (2013.01); *G01R 27/2694* (2013.01); *G01R 31/1272* (2013.01)

(58) Field of Classification Search
CPC ............ G01R 31/021; G01R 31/2601; G01R 31/2839; G01N 27/028; H01L 22/20; H03L 7/07; H03L 7/199
(Continued)

(56) References Cited

U.S. PATENT DOCUMENTS 5,122,945 A * 6/1992 Marawi ............. H02M 3/33561
363/21.1
6,373,260 B1 * 4/2002 Weller .................. G01R 1/067
324/603

FOREIGN PATENT DOCUMENTS

DE 19513441 A1 10/1996
DE 102012024560 B3 3/2014
DE 102013008611 A1 11/2014

OTHER PUBLICATIONS

Kearley, S.J.; Mackinlay, R.R.: Discharge measurements in cables using a solid state 30 kV bipolar low frequency generator. In: Dielectric Materials, Measurements and Applications, 1988, Fifth International Conference on, 1988, 171-174.

* cited by examiner

*Primary Examiner* — Melissa Koval
*Assistant Examiner* — Trung Nguyen
(74) *Attorney, Agent, or Firm* — Michael Soderman

(57) ABSTRACT

The invention relates to circuit arrangements for cable checking, cable testing, cable diagnosis and/or cable fault localization with
  a voltage source having a first voltage multiplier for a positive voltage and a second voltage multiplier for a negative voltage
  current sources that are connected to one another in combination with the voltage multipliers to generate a test voltage over the load impedance of the cable to charge and discharge the load capacitance of the cable and
  a control device that is interconnected with the voltage source and the current sources and
devices with a circuit arrangement of that type.
The circuit arrangements distinguish themselves, in particular, by the fact that arbitrary voltage curves of different
(Continued)

amplitudes can be generated through the cable as the impedance acting as the test specimen.

15 Claims, 10 Drawing Sheets

(51) Int. Cl.
 *G01R 27/26* (2006.01)
 *G01R 31/12* (2006.01)
(58) Field of Classification Search
 USPC .............. 324/500, 537, 756.01–758.01,
  324/750.01–750.04, 750.15, 750.24, 539,
  324/543, 750.3, 754.07, 763.01, 604–683;
  455/78, 83, 552.1, 130, 217, 296
 See application file for complete search history.

CIRCUIT ARRANGEMENT FOR CABLE CHECKING, CABLE TESTING, CABLE DIAGNOSIS AND/OR CABLE FAULT LOCALIZATION AND DEVICE WITH A CIRCUIT ARRANGEMENT OF THAT TYPE

CROSS REFERENCE TO RELATED APPLICATIONS

This application claims the priority of German Application No. DE 102015202597.7 filed on Feb. 12, 2015; this application is incorporated by reference herein in its entirety.

BACKGROUND

The invention relates to circuit arrangements for cable checking, cable testing, cable diagnosis and/or cable fault localization with
- a voltage source having a first voltage multiplier for a positive voltage and a second voltage multiplier for a negative voltage
- current sources that are connected to one another in combination with the voltage multipliers to generate a test voltage over the load impedance of the cable to charge and discharge the load capacitance of the cable and
- a control device that is interconnected with the voltage source and the current sources and devices with a circuit arrangement of that type.

A method of checking the insulation of electrical operating equipment and a circuit arrangement for carrying out the method are known from the document DE 195 13 441 A1. A circuit arrangement of that type can be used to measure the loss factor. The loss factor (tan delta) of the test specimen is determined from the phase positions of the test voltage and the test current induced from that. The loss factor is a measurement of the loss of the energy that is electrically or electromagnetically dissipated and is therefore a characteristic of the electrical properties of the test specimen. The AC voltage for the testing is generated in multiple steps from a mains voltage. A DC voltage is generated from the mains voltage with the aid of a rectifier. This is converted into AC voltages with the mains frequency or a multiple of the mains frequency, which are modulated in terms of their amplitude with AC voltages of a lower frequency. A high, amplitude-modulated voltage with a very low frequency, with which a test specimen is charged up in a defined manner via a rectifying circuit and subsequently discharged in a defined manner via a high-voltage circuit breaker, is generated via conversion of the low voltages by means of high-voltage transformers. Via a control process, the course of the high voltage measured over a voltage divider is compared in a time-critical fashion with the desired preprogrammed waveform and amplitude and adherence is guaranteed, among other ways, via intervention into the switching points in time in switching elements of H bridges. This regulatory intervention leads to corners in the progression of the test voltage, which in turn cause harmonic waves and noise. There is a negative influence on the precision of the measurement process because of that.

The document DE 10 2012 024 560 B3 involves a circuit arrangement and a method for generating a test voltage and a testing device for determining a loss factor that contains the circuit arrangement. The circuit arrangement is essentially comprised of two high-voltage sources for generating a positive and a negative high voltage with a variable amplitude and a high-voltage switch arrangement arranged between the outputs of the high-voltage sources and the test specimen for successive charging and discharging of the test specimen. Via a control process, the current test voltage is measured in the test specimen and, in dependence upon that, it influences the high-voltage switch arrangement for defined charging and discharging of the test specimen. The control process does not have an effect on the high-voltage sources. A separate control unit connected to the high-voltage sources generates an independent clock signal, so a high voltage is provided that is synchronized, predefined and not influenced by the control process. The high-voltage sources provide a high voltage of variable amplitude that is synchronized with the aid of a clock signal and precisely predefined in terms of its waveform and phase position.

The high-voltage switch arrangement is comprised of two semiconductor switch arrangements in the form of voltage-controlled current sources that are fed back via an amplifier in each case. A lead-in voltage that puts the current sources in a position to regulate the output voltage is necessary for the operation of the current sources. At the same time, efforts are taken to keep the lead-in voltage as small as possible and to consequently minimize the power dissipation. It is to be noted in this context that the output current is chiefly determined by the choice of the test voltage and the test specimen that is connected. It cannot be influenced by a suitable design of the high-voltage testing device. A lead-in voltage that is higher than that in the solution in the document DE 195 13 441 A1 is therefore required to regulate the current sources.

The document DE 10 2013 008 611 A1 involves a high-performance, high-voltage testing device; the means for generating the test voltage have at least two voltage-amplifying branches, of which a first voltage-amplifying branch serves to generate the positive half-cycles of the test voltage and a second voltage-amplifying branch serves to generate the negative voltage half-cycles of the test voltage. Furthermore, a measuring circuit exists to measure the test voltage to be applied to a test object and the test current caused by this in the test object. The testing device distinguishes itself by the fact that each voltage-amplifying branch is built into a separate assembly with integrated active air cooling.

Moreover, a circuit arrangement for a voltage amplitude of at least 100 kV as well is known from the document Kearley, S. J.; MacKinlay, R. R.: Discharge measurements in cables using a solid state 30 kV bipolar low frequency generator. In: Dielectric Materials, Measurements and Applications, 1988, Fifth International Conference on, 1988, 171-174. A test voltage that can be regulated in terms of its curve is generated via a semiconductor switch arrangement acting as a controllable current source for defined charging and discharging of a test object; the positive or negative high voltage generated by the upstream components of the voltage-amplifying branch can be transformed into positive or negative half-cycles with an evaluation of the test current and/or the test voltage measured in the test object.

SUMMARY

The invention relates to circuit arrangements for cable checking, cable testing, cable diagnosis and/or cable fault localization with
- a voltage source having a first voltage multiplier for a positive voltage and a second voltage multiplier for a negative voltage
- current sources that are connected to one another in combination with the voltage multipliers to generate a test voltage over the load impedance of the cable to charge and discharge the load capacitance of the cable and a control device that is interconnected with the voltage source and the current sources and devices with a circuit arrangement of that type.

The circuit arrangements distinguish themselves, in particular, by the fact that arbitrary voltage curves of different amplitudes can be generated through the cable as the impedance acting as the test specimen.

The control device has a digital signal processor for this to regulate the test voltage measured over a voltage divider through the load impedance of the cable and to specify the target value of the voltage source. The voltage multipliers are either connected to two main converters or to both a main converter and an auxiliary converter that generates a positive and a negative auxiliary voltage.

DETAILED DESCRIPTION

The invention specified in the claims is based on the objective of generating arbitrary voltage curves of different amplitudes through a cable as the impedance acting as the test specimen.

This problem is solved with the elements specified in the claims.

The circuit arrangements for cable checking, cable testing, cable diagnosis and/or cable fault localization with a voltage source having a first voltage multiplier for a positive voltage and a second voltage multiplier for a negative voltage current sources that are connected to one another in combination with the voltage multipliers to generate a test voltage over the load impedance of the cable to charge and discharge the load capacitance of the cable and a control device that is interconnected with the voltage source and the current sources, distinguish themselves, in particular, by the fact that arbitrary voltage curves of different amplitudes can be generated through the cable as the impedance acting as the test specimen.

The control device has a digital signal processor for this to regulate the test voltage measured over a voltage divider through the load impedance of the cable and to specify the target value of the voltage source. The voltage multipliers are either connected to two main converters or to both a main converter and an auxiliary converter generating a positive and a negative auxiliary voltage in such a way that there is either a positive voltage corresponding to the target value specification and a constant, unregulated negative voltage or there is a negative voltage corresponding to the target value specification and a constant, unregulated positive voltage at the outputs of the voltage multipliers. In the process, the unregulated voltage in each case is either generated by the respective main converter or by the unregulated auxiliary converter. The voltage multipliers are interconnected to the current sources via a coupling diode, so a back-feed of the voltage multipliers is prevented. The current sources that are connected to one another are connected to the voltage divider and the cable via at least one protective resistor. Furthermore, the two reference potentials of the voltage multipliers that are connected to one another are connected to the reference potential of the cable via a measurement impedance adaptable to the measuring range; the reference potentials of the voltage multipliers and the reference potential of the voltage divider are an auxiliary ground.

Any desired voltage curves can be advantageously generated via an impedance with the circuit arrangement. That takes place via the control device, which contains a digital signal processor. Moreover, the current can be very precisely measured through this impedance. The circuit arrangement therefore represents and arbitrary function generator that is simultaneously a highly precise measurement instrument for ohmic, capacitive and ohmic-capacitive loads, especially for the determination of the loss factor.

In a first variant, the circuit arrangement is comprised of a voltage source with an auxiliary converter that generates an unregulated positive and negative DC voltage with a fixed amplitude. In addition, there is a main converter that can be hooked up to the respective voltage multiplier. A positive voltage with a variable amplitude can therefore be generated at the positive voltage multiplier, whereas the unregulated negative voltage of the auxiliary converter simultaneously exists at the negative voltage multiplier. Furthermore, a negative voltage with a variable amplitude can be generated at the negative voltage multiplier, whereas the unregulated positive voltage of the auxiliary converter simultaneously exists at the positive voltage multiplier.

In a second variant, the circuit arrangement is comprised of a voltage source with main converters that are connected to the voltage multipliers. A positive voltage with a variable amplitude can therefore be generated at the positive voltage multiplier, whereas an unregulated negative voltage of the other main converter simultaneously exists at the negative voltage multiplier. Moreover, a negative voltage with a variable amplitude can be generated at the negative voltage multiplier, whereas an unregulated positive voltage of the other main converter simultaneously exists at the positive voltage multiplier. An unregulated positive and negative DC voltage with a fixed amplitude is therefore generated through the other main converter in each case.

In both variants, the voltage across the current sources can therefore not be smaller than the respective DC voltage with a fixed amplitude. The output voltage is regulated with the aid of the current sources, and the cable is thereby actuated. The current sources are driven with the aid of pulse width modulation. The current sources have voltage-controlled transistors. In particular, potential-free, voltage-controlled current sources can be used.

The voltage across the cable as the test specimen follows the set value from the digital signal processor as the control device. The control device is also a control device registering measured values from the voltage divider for that; it also controls/regulates the voltage source and the current sources in accordance with the specifications of the digital signal processor. The voltage at the positive voltage multiplier is therefore in the exact phase position and synchronous to the voltage over the cable as the test specimen when there is a positive algebraic sign of the reference. The voltage at the negative voltage multiplier is in the exact phase position and synchronous to the voltage over the cable as the test specimen when there is a negative algebraic sign of the reference. The voltage divider is a high-voltage measuring divider for that.

The two low ends of the voltage multipliers that are connected to one another are connected to the low end of the test specimen as the load impedance via the measurement impedance that is adaptable to the measuring range for precise recording of the measured values. The low ends of the high-voltage cascades are therefore connected to the auxiliary ground. The direction of the current can be measured with the auxiliary ground. A high-resolution and precise measurement of the loss factor (tan delta) of the cable is therefore possible.

The device for cable checking, cable testing, cable diagnosis and/or cable fault localization is comprised of the circuit arrangement. The voltage source is located in a shielded enclosure; the enclosure is the auxiliary ground. A connecting lead of the cable is a shielded connecting lead; the shielding of the connecting lead is connected to the auxiliary ground. The leakage currents otherwise flowing to the cable shield of the connecting lead and those flowing to the enclosure of the voltage source are therefore advantageously not recorded. There is exclusively a measurement of the current that flows in the cable as the text specimen.

Highly precise loss-factor measurements in the form of tan delta measurements are advantageously possible with the circuit arrangement and the device. The measurement precision can be $1 \times 10^{-4}$ over the entire voltage range. This could range from 1 kV up to and including 250 kV in each case.

The cable is cyclically charged and discharged here, for instance, when there is a cable check or cable diagnosis. The heat dissipation arising during the discharge process has to be carried off. The voltage over the current sources, as the lead-in voltage, can be in a range from 300 V to 10 kV so that the regulation and the current sources operate themselves. The lower the lead-in voltage here, the lower the power dissipation in the current sources. The voltage over the current sources is carried along in dependence upon the digital signal processor of the control device for that.

In the case of cable fault localization, a voltage pulse is applied to the cable and the reflected voltages are recorded as partial discharges and allocated to the cable end and possible faults in the cable. The device is advantageously suited to be a voltage source for cable-sheath fault localization.

Advantageous design forms of the invention are specified in the subordinate claims.

According to a further design form, the control device is connected to the main converters via a switching arrangement. On the one hand, a voltage of one potential carried in accordance with the voltage of the digital signal processor is applied here to the voltage multiplier connected via a main converter to the control device. On the other hand, the other main converter that is not connected to the control device generates an unregulated voltage of the other potential. A voltage therefore always exists over the current sources. The switching arrangement itself can be a software or hardware switch. Furthermore, it can be a switching arrangement wherein the positive branch only reacts to positive algebraic signs and the negative branch only reacts to negative algebraic signs of the target-value specification. The connection is not physically separated here; the signal flow is only guided in an appropriate way.

According to another design form, the main converters are connected with one another in such a way that the switches of the main converter switch with a synchronous frequency or with a synchronous frequency with phase-shifted switching points to reduce or eliminate beat effects and electrical interference.

The auxiliary converter, as a positive and negative voltage source, is comprised of a DC/AC converter interconnected to the transformer on the primary side and voltage multipliers connected to the secondary side for the positive and negative high voltage.

According to a further design form, the auxiliary converter is connected to voltage multipliers and the main converter is connected via a switching arrangement to the voltage multipliers. Furthermore, the main converter and the switching arrangement are interconnected to the control device in such a way that the voltage of the auxiliary converter and the voltage of the main converter carried in accordance with the voltage of the digital signal processor, of one potential in each case, exist at the voltage multiplier connected via the switching arrangement to the main converter and that the other voltage multiplier is only connected to the auxiliary converter, so an unregulated voltage of the other potential exists at this voltage multiplier. The voltage multipliers are decoupled via diodes for that.

According to a further design form, the auxiliary converter is connected to voltage multipliers and the main converter is connected via a switching arrangement to the voltage multipliers. The main converter and the switching arrangement are interconnected to the control device in such a way that the voltage of the auxiliary converter and the voltage of the main converter carried in accordance with the voltage of the digital signal processor, of one potential each, exist at the voltage multiplier connected via the switching arrangement to the main converter and that the other voltage multiplier is only connected to the auxiliary converter, so an unregulated voltage of the other potential exists at this voltage multiplier.

According to an additional design form, the main converter is connected to the control device in such a way that the main converter is separated from the voltage multipliers during the zero crossing of the load voltage; the auxiliary converter therefore only autonomously generates the positive and the negative high voltage at the outputs of the voltage multipliers and, consequently, only the voltage of the auxiliary converter exists at the outputs of the voltage multipliers.

The digital signal processor is, according to a further design form, a digital sine-wave generator outputting a digital sine wave as a reference sine wave. Furthermore, the control device is a control device adding a constant to the reference sine wave. Thus, on the one hand, there is an exact phase position and offset between the voltage at the output of the positive voltage multiplier and the positive half-oscillation of the load voltage during the positive half-oscillation of the load voltage; an asynchronous and unregulated negative DC voltage is simultaneously generated by the auxiliary converter for the positive half-oscillation at the negative voltage multiplier. On the other hand, there is an exact phase position and offset between the voltage at the output of the negative voltage multiplier and the negative half-oscillation of the load voltage during the negative half-oscillation of the load voltage; an asynchronous and unregulated positive DC voltage is simultaneously generated by the auxiliary converter for the negative half-oscillation at the positive voltage multiplier.

The digital signal processor is, according to another design form, a digital sine-wave generator outputting a digital sine wave. The control device is control device that polls the output voltages of the voltage multipliers of the voltage source and that calculates new target values from the digital sine-wave generator. Furthermore, the control device is a control device that regulates the voltage over the cable as the test specimen based on the new target value from the digital sine-wave generator.

According to a further design form, the main converter is a main converter that transforms the mains voltage; a rectifier, a device for generating AC voltage with a full bridge or a half bridge and a resonant circuit for feeding a transformer and the transformer are interconnected one after the other.

The voltage multiplier is, according to an additional design form, a high-voltage cascade in the form of a well-known Greinacher circuit or in the form of a high-voltage cascade derived from the Greinacher circuit with full-wave rectification without a smoothing column.

In an advantageous fashion, the protective resistor is simultaneously a discharging resistor according to another design form.

According to a further design form, the current source is a potential-free, voltage-controlled current source to control the high-voltage source with a series circuit made up of a resistor, voltage-controlled transistors connected in series between the potentials and a control circuit connected to the voltage-controlled transistors with an optical receiver and an operational amplifier. A zener diode, a suppression diode or a linear voltage regulator is connected between the transistors, which are connected in series, and the resistor. The free connector of the resistor is a potential of the potential-free, voltage-controlled current source. Moreover, either the voltage existing across the zener diode, the suppression diode or the linear voltage regulator or the voltage existing across the resistance and the zener diode, the suppression diode or the linear voltage regulator is the supply voltage of the control circuit.

The potential-free, voltage-controlled current sources can therefore be simply operated at the high-voltage potential.

The power for the control circuit of the current source is obtained from the current that flows through the current source itself. A problematic, inductive, auxiliary power transmission process that would otherwise exist can therefore be eliminated. The signal transmission for the control takes place in a simple and potential-free manner through a fiber-optic cable. The fiber-optic cable simultaneously offers a very favorable and simple possibility to provide insulation between a grounded regulator of the current sources and the controls of the current sources, for instance in a high-voltage testing device.

There are therefore the advantages that a transformer is not required to supply power to the control circuit, only one fiber-optic cable has to be laid to the low end of the control circuit, the insulation is easy to realize with very high voltages and frequencies and a potential-free current source is available for voltages of any arbitrary amplitude.

Further, the current source can have a gate-voltage balancing system with gate resistors connected in series for the voltage-controlled transistors that are connected in series to balance and provide the control voltages for the gates of the transistors.

According to an additional design form, the voltage divider is a high-voltage measuring divider. First parallel circuits comprised in each case of an ohmic resistor and a capacitor are connected in series on plate-shaped component supports, and at least one second parallel circuit made up of an ohmic resistor and at least one capacitor is arranged on at least one of the component supports. At least three component supports are arranged on top of one another. At least one component support has field-control elements on outward edges. The field-control elements are comprised of cylindrical or tube-shaped pieces made of an electrically conductive material with end areas designed in the form of spherical caps. The outer component supports having at least the first parallel circuits are field-control components here, and the component support in the middle with the first parallel circuits and the second parallel circuit are the measuring voltage divider; the connection between the first parallel circuits and the second parallel circuit of the measuring voltage divider is the tap point of the high-voltage measuring divider, and the first parallel circuits of the field-control components and the series connection made up of the first parallel circuits and the second parallel circuit of the measuring-voltage divider connected in parallel to one another are the further connections of the high-voltage measuring divider.

The high-voltage measuring divider distinguishes itself, in particular, by very strong independence from parasitical elements.

Thus, the high-voltage measuring divider is very much independent from parasitic bleeder resistances, from parasitic ground capacitance and from the electrical and dielectric properties of the insulation medium.

A realistic voltage divider has, as a physical object, a surface that forms a capacitance with the surface of the ground electrode. The medium between the voltage divider and the ground electrode has a specific electrical resistance. A resistance therefore results between the surface of the voltage divider and the surface of the ground electrode, which will be called a parasitic bleeder resistance below. The bleeder resistance results from the product of the specific resistance and the ratio of the length to the area.

A high-voltage testing device with a compact design forces the insulation of the high-voltage components with respect to the ground electrode with insulation media, for instance potting material. A physical proximity to the ground electrode always comes about. The parasitic influences of the ground capacitance and the bleeder resistance are aided because of that.

The parasitic ground capacitance increases based on the laws of nature by the factor of the value of the dielectric constants of the insulation medium. The dielectric constants of solid or liquid insulation media have the characteristic of not being stable for the required operational temperature range. The parasitic ground capacitance is therefore not constant over the temperature.

The specific electrical resistances of solid or liquid insulation media have the characteristic of not being stable for the required operational temperature range. The parasitic bleeder resistance is therefore not constant over the temperature. The temperature instability of the dielectric values is especially serious in the case of solid insulation media with high thermal conductivity.

The linear voltage distribution over the voltage divider is distorted because of the parasitic bleeder resistance, and the phase position of the output voltage is distorted because of the parasitic ground capacitance. Consequently, correct information regarding the amplitude and the phase position is no longer possible in the measurement recording of the output voltage.

A highly precise measurement of the loss factor (tan delta) is no longer possible because of that.

The high-voltage measuring divider advantageously distinguishes itself by the fact that an influence of the parasitic elements is prevented. It is essentially comprised of series connection of the first parallel circuits and the at least one second parallel circuit. Because of the parallel connection of the three component supports that are spaced apart from each other, the component support in the middle, as the measuring voltage divider, is embedded in a "field-free" space with the series connections of the first parallel circuits made up of an ohmic resistance and a capacitor and the second parallel circuit. The outer supports act as field-control elements.

The correct phase position and the correct amplitude of the voltage can thereby be measured independently of outside temperature influences and independently of the installation position in a device via the high-voltage measuring divider.

The high-voltage measuring divider is consequently independent of the parasitic bleeder resistance, of the parasitic ground capacitance and of the electrical and dielectric properties of the insulation medium.

A highly precise measurement of the loss factor (tan delta) is possible without additional, subsequent corrections.

The basic principle existing here of the quasi envelopment or shielding of the high-voltage measuring divider by the same types of component supports with voltage dividers can also be used for large high-voltage measuring dividers that are set up outside.

The components of the parallel-connected, shielding, outer component supports with voltage dividers can also have different dimensions than the central and actual measuring voltage divider. The overall power dissipation in the resistors can therefore be kept small, as an example.

The enclosure, the current sources, the control device, the coupling diodes, the protective resistor and the voltage divider are, according to the further design form, arranged in a housing that is connected or that can be connected to ground potential, so the device is a mobile device or the device is located in a vehicle.

An example of the invention be shown in the drawings in the form of its basic structure in each case, and the examples will be described in more detail below.

DETAILED DESCRIPTION OF THE PREFERRED EMBODIMENT

Figure 1:
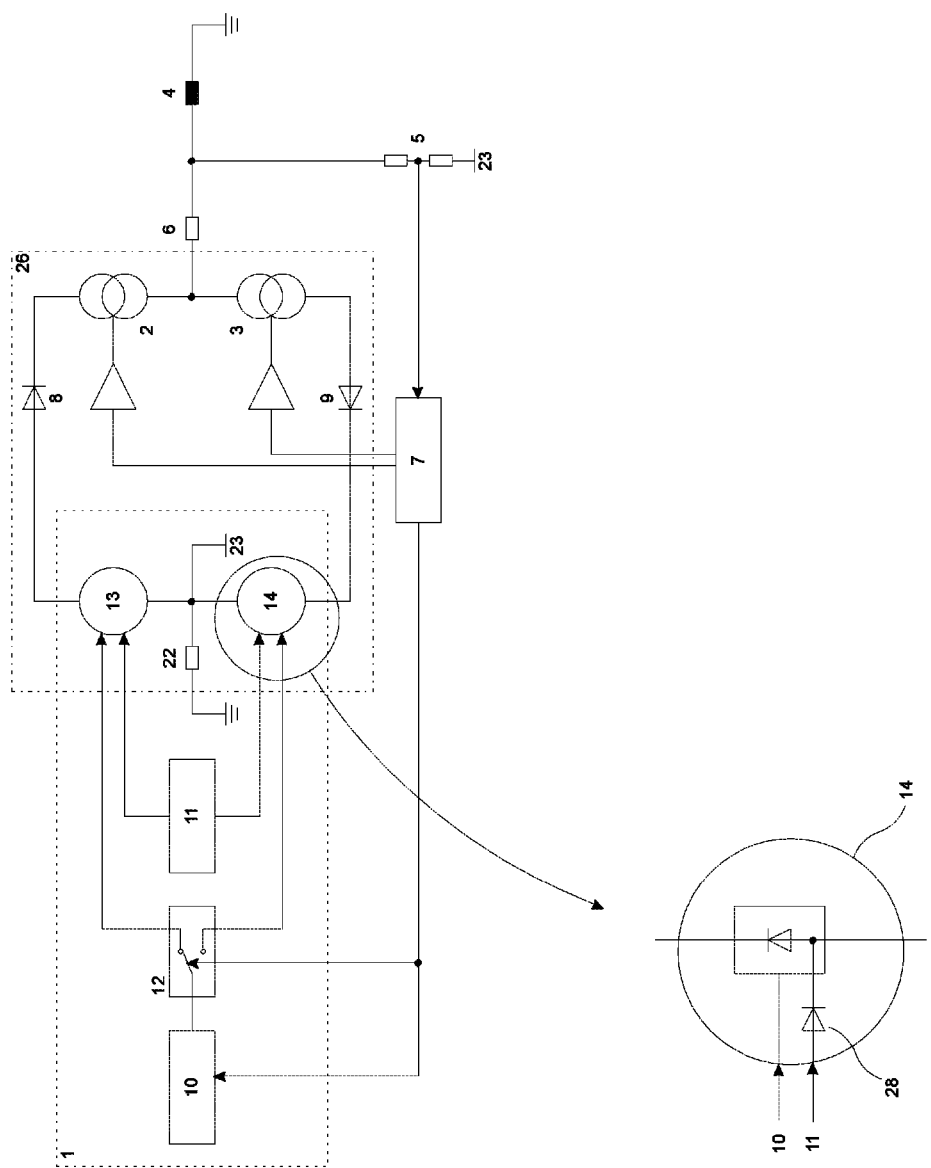
FIG. 1 shows a circuit arrangement for cable checking, cable testing, cable diagnosis and/or cable fault localization with a main converter and an auxiliary converter.

A circuit arrangement for cable checking, cable testing, cable diagnosis and/or cable fault localization is essentially comprised of a voltage source 1, a measurement impedance 22, current sources 2 and 3, a voltage divider 5 a protective resistor 6, a control device 7, coupling diodes 8 and 9, in combination with a cable 4 as a test specimen.

A test voltage is generated with the voltage source 1 in combination with the current sources 2, 3 and the control device 7. It can be generated through the load impedance of the cable 4 to charge and discharge the load capacitance of the cable 4. The current sources 2, 3 that are connected with one another are connected via the protective resistor 6 to the cable 4 and the voltage divider 5 for that. The control device 7 has a digital signal processor to regulate the test voltage over the load impedance of the cable 4 measured across the voltage divider 5 and to specify the target value of the voltage source 1.

In a first embodiment of the example, the voltage source 1 has a main converter 10, an auxiliary converter 11, a switching arrangement 12 and a first voltage multiplier 13 for a positive voltage and a second voltage multiplier 14 for a negative voltage. FIG. 1 shows a circuit arrangement for cable checking, cable testing, cable diagnosis and/or cable fault localization with a main converter 10 and an auxiliary converter 11 in a basic diagram.

The first voltage multiplier 13 for a positive voltage and the second voltage multiplier 14 for a negative voltage of the voltage source 1 are interconnected via the coupling diodes 8, 9 to the current sources 2, 3 that are connected to one another, forming an intermediate circuit 26 with an intermediate-circuit voltage. The coupling diodes 8, 9 prevent back-feed from the voltage multipliers 13, 14.

Figure 2:
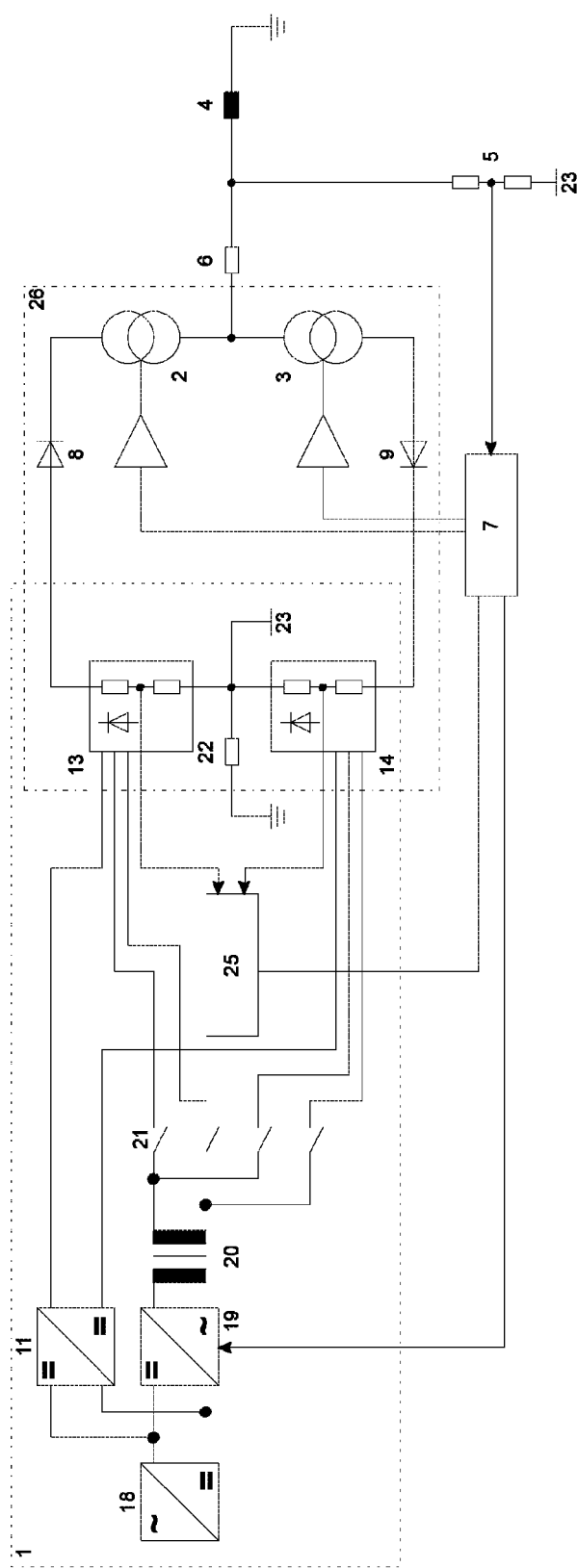
FIG. 2 shows a circuit arrangement for cable checking, cable testing, cable diagnosis and/or cable fault localization with a concrete realization of the main converter and auxiliary converter.

FIG. 2 shows a circuit arrangement for cable checking, cable testing, cable diagnosis and/or cable fault localization with a concrete realization of the main converter 10 and auxiliary converter 11 in a basic diagram.

The voltage multipliers 13, 14 are connected to both a main converter 10 and an auxiliary converter 11 that generates a positive and a negative auxiliary voltage in such a way that either a positive voltage corresponding to the target-value specification and a constant, unregulated negative voltage, or a negative voltage corresponding to the target-value specification and a constant, unregulated positive voltage, exist at the outputs of the voltage multipliers 13, 14; the respective unregulated voltage is generated by the unregulated auxiliary converter 11. There is therefore always a voltage in the form of a minimum voltage across the current sources 2, 3. The auxiliary converter 11 is connected via diodes 28 to voltage multipliers 13, 14.

Figure 3:
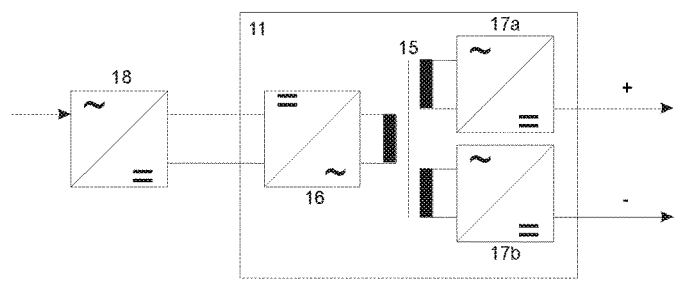
FIG. 3 shows a circuit arrangement of an auxiliary converter.

FIG. 3 shows a circuit arrangement of an auxiliary converter 11 in a basic diagram. The auxiliary converter 11, as a positive and negative voltage source, has to this end a DC/AC converter 16 connected to a transformer 15 on the primary side and voltage multipliers 17a, 17b connected on the secondary side for the positive and negative voltage.

The main converter 10 is a main converter 10 transforming the mains voltage; to this end, a rectifier 18, a device 19 for generating AC voltage with a full bridge or a half bridge and a resonant circuit to feed a transformer 20, the transformer 20 and a relay 21 for making contact with the required voltage multiplier 13, 14 are connected one after the other. The rectifier 18 is simultaneously the rectifier for the auxiliary converter 11 for that.

The voltage multipliers 13, 14 are connected, on the one hand, to the auxiliary converter 11 and, on the other hand, to the main converter 10 via the switching arrangement 12. The switching arrangement 12 is actuated by means of the control device 7, so the voltage of the auxiliary converter 11 and the voltage of the main converter 10 carried in accordance with the voltage of the digital signal processor, of one potential each, exist at the voltage multiplier 13, 14 connected via the switching arrangement 12 to the main converter 10 and the other voltage multiplier 13, 14 is only connected to the auxiliary converter 11, so an unregulated voltage of the other potential exists at this voltage multiplier 13, 14.

Voltage dividers 24 are available to determine the voltages of the voltage multipliers 13, 14. The voltage values are recorded via a measurement recording unit 25 and polled via the control device 7.

The two reference potentials of the voltage multipliers 13, 14 that are connected to one another are connected via a measurement impedance 22 adaptable to the measuring range to the reference potential of the cable 4; the reference potentials of the voltage multipliers 13, 14 and the reference potential of the voltage divider 5 are an auxiliary ground 23. An optimal adjustment of the measuring range can be accomplished via the measurement impedance 22. It can be comprised of several switchable resistors and capacitors.

Figure 4:
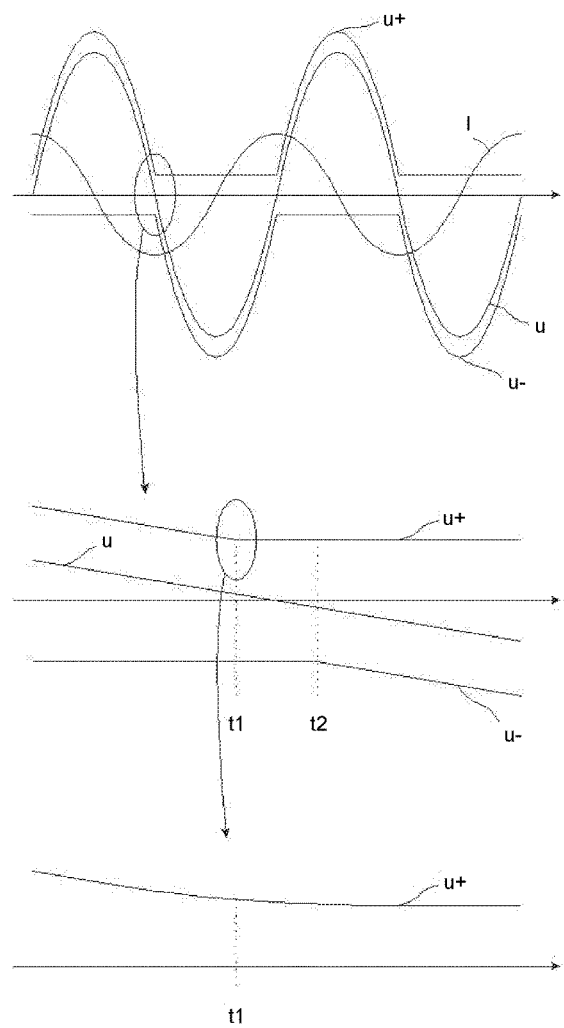
FIG. 4 shows progressions of curves in a time range.

FIG. 4 shows curve progressions in a time range in a basic diagram.

In a first design variant of the first embodiment of the example, the digital signal processor can be a digital sine-wave generator outputting a digital sine wave as a reference sine wave. The main converter 10 is connected to the control device 7 in such a way that the main converter 10 is separated from the voltage multipliers 13, 14 during the zero crossing of the load voltage; the auxiliary converter 11 therefore only autonomously generates the positive and the negative high voltage at the outputs of the voltage multipliers 13, 14 and, consequently, only the voltage of the auxiliary converter 11 exists at the outputs of the voltage multipliers 13, 14.

FIG. 4 shows the following:
a) the progression of the curve in a time range,
b) a section wherein only the auxiliary converter 11 is active in the time range t1 to t2 and
c) a section regarding the point in time t1 that is enlarged once again; the course of the voltage u+ corresponds to that of a differentiable function at every point in time. The same applies to the voltage u− with regard to the point in time t2.

The lead-in voltage is supposed to correspond to a differentiable function at every point, meaning the course of the lead-in voltage does not have any sharp corners. This requirement is autonomously fulfilled by the high-voltage source 1 via appropriate programming in the control device 7 or is already taken into consideration in the specification of the target value.

Figure 5:
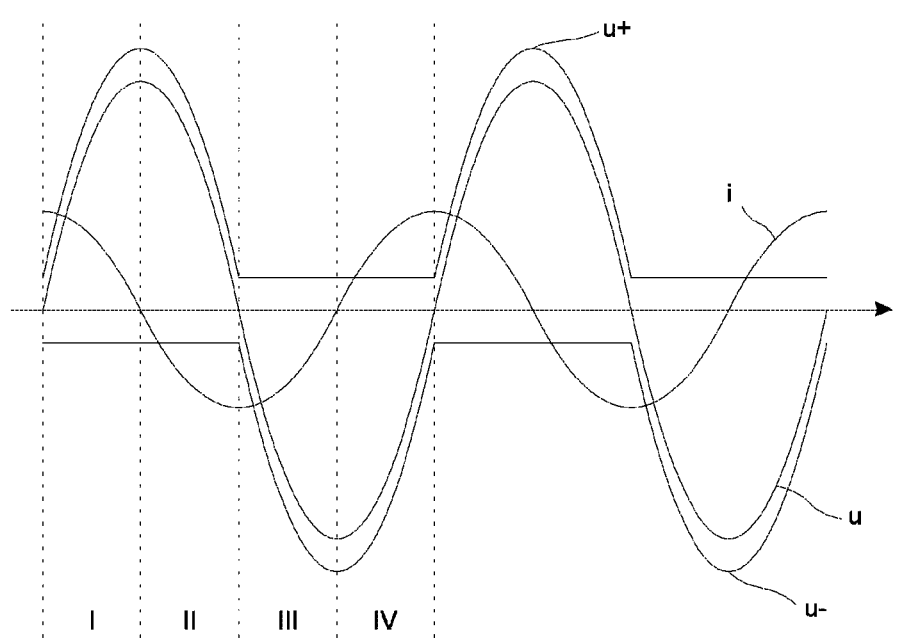
FIG. 5 shows a subdivided curve progression.

FIG. 5 shows a subdivided curve progression in a basic diagram. A examination of the power dissipation is shown for elucidation in FIG. 5. A period is divided up into the ranges I, II, III and IV for that. The following applies here:

Range I Charging the capacitor to a positive voltage $$P_V = |i \cdot (u^+ - u|)$$

This power dissipation arises in the current source 2
Range II Discharging the capacitor $$P_V = |i \cdot (u - u^-|)$$

This power dissipation arises in the current source 3
Range III Charging the capacitor to a negative voltage $$P_V = |i \cdot (u - u^-|)$$

This power dissipation arises in the current source 3
Range IV Discharging the capacitor $$P_V = |i \cdot (u^+ - u|)$$

This power dissipation arises in the current source 2

This examination of the power dissipation is idealized. Additional power dissipation, for instance via the leakage current, are not significant and are therefore not considered in more detail.

As can be seen, the differences $|u^+ - u|$ and $|u^- - u|$ responsible for the power dissipation are clearly small.

The control device 7 can be a control device 7 that adds a constant to the reference sine wave, so on the one hand, there is an exact phase position and offset between the voltage at the output of the positive voltage multiplier 13 and the positive half-oscillation of the load voltage during the positive half-oscillation of the load voltage; an asynchronous and unregulated negative DC voltage is simultaneously generated by the auxiliary converter 11 for the positive half-oscillation at the negative voltage multiplier 14, and on the other hand, there is an exact phase position and offset between the voltage at the output of the negative voltage multiplier 14 and the negative half-oscillation of the load voltage during the negative half-oscillation of the load voltage; an asynchronous and unregulated positive DC voltage is simultaneously generated by the auxiliary converter 11 for the negative half-oscillation at the positive voltage multiplier 13.

In a second embodiment of the example, the voltage source 1 has a first main converter 10a, a second main converter 10b, a switching arrangement 12 and the first voltage multiplier 13 for a positive voltage and the second voltage multiplier 14 for a negative voltage.

Figure 6:
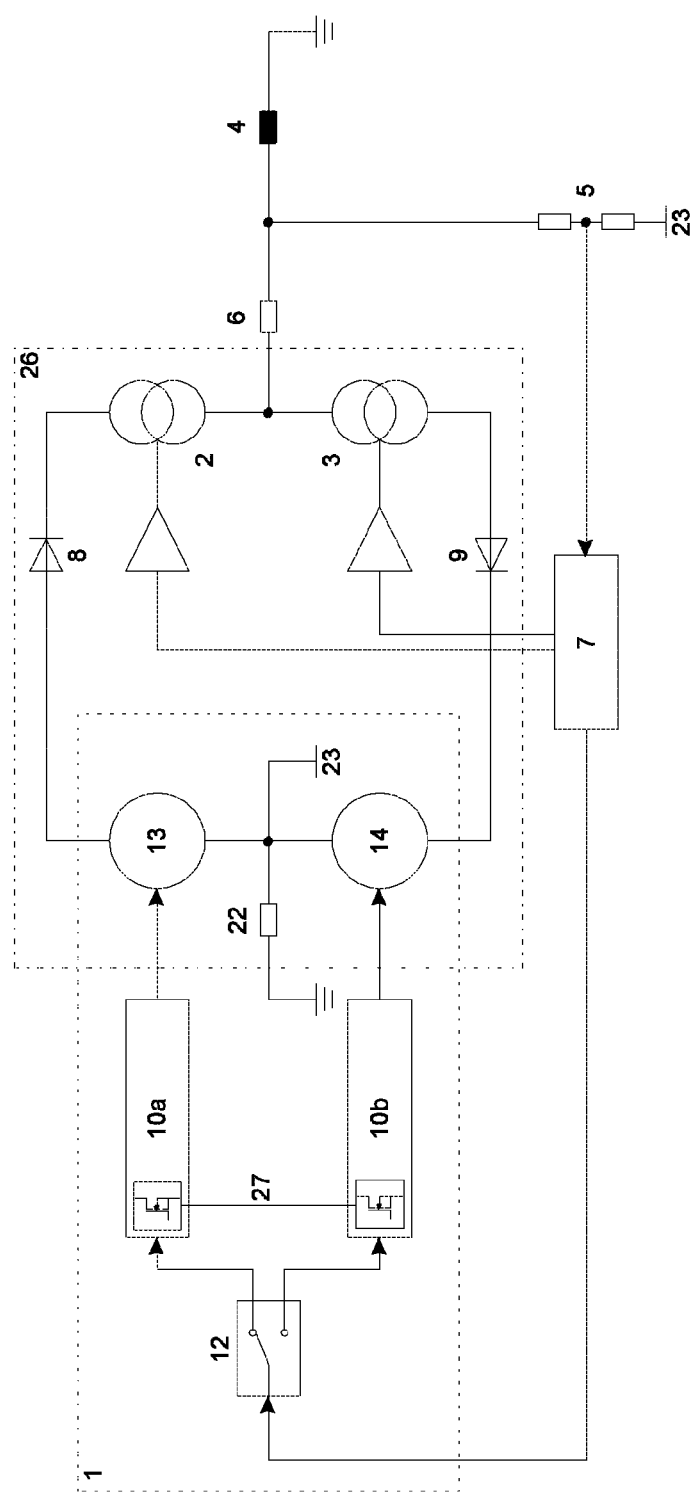
FIG. 6 shows a circuit arrangement for cable checking, cable testing, cable diagnosis and/or cable fault localization with two main converters.

FIG. 6 shows a circuit arrangement for cable checking, cable testing, cable diagnosis and/or cable fault localization with two main converters 10a, 10b in a basic diagram. The main converters 10a, 10b correspond in terms of their function in each case to the main converter 10 of the first embodiment of the example.

The voltage multipliers 13, 14 are connected to the main converters 10a, 10b in such a way that either a positive voltage of the main converter 10a corresponding to the target-value specification and a constant, unregulated negative voltage of the main converter 10b, or a negative voltage of the main converter 10b corresponding to the target-value specification and a constant, unregulated positive voltage of the main converter 10a, exist at the outputs of the voltage multipliers 13, 14. The first voltage multiplier 13 for a positive voltage and the second voltage multiplier 14 for a negative voltage of the voltage source 1 are interconnected via the coupling diodes 8, 9 to the current sources 2, 3 that are connected to one another, forming an intermediate circuit 26 with an intermediate-circuit voltage. The coupling diodes 8, 9 prevent back-feed from the voltage multipliers 13, 14.

The unregulated voltage in each case is generated by the respective main converter 10a, 10b. To this end, the control device 7 is connected via the switching arrangement 12 to the main converters 10a, 10b in such a way that a voltage of one potential carried in accordance with the voltage of the digital signal processor exists at the voltage multiplier 13, 14 connected via the one main converter 10a, 10b to the control device 7 and that the other main converter 10a, 10b that is not connected to the control device 7 generates an unregulated voltage of the other potential. There is therefore always a voltage in the form of a minimum voltage across the current sources 2, 3.

The main converters 10a, 10b can be interconnected with one another via a connection 27 in such a way that the switches of the main converters 10a, 10b switch with a synchronous frequency or with a synchronous frequency with phase-shifted switching points to reduce or eliminate beat effects and electrical interference. Voltage dividers 24 are available to determine the voltages of the voltage multipliers 13, 14. The voltage values are recorded via a measurement recording unit 25 and polled via the control device 7.

The two reference potentials of the voltage multipliers 13, 14 that are connected to the another are connected via the measurement impedance 22 adaptable to the measuring range to the reference potential of the cable 4; the reference potentials of the voltage multipliers 13, 14 and the reference potential of the voltage divider 5 are an auxiliary ground 23. An optimal adjustment of the measuring range can be accomplished via the measurement impedance 22. It can be comprised of several switchable resistors and capacitors.

The presentation of FIG. 5 shows a subdivided curve progression in a time range in a basic diagram.

In a design variant of the second embodiment, the digital signal processor can be a digital sine-wave generator outputting a digital sine wave as a reference sine wave.

The control device 7 is a control device 7 that polls the output voltages of the voltage multipliers 13, 14 of the voltage source 1, a control device 7 that calculates the new target values from the digital sine-wave generator and a control device 7 that regulates the voltage across the cable 4 as the test specimen to the new target value from the digital sine-wave generator.

A consideration of power dissipation is shown for elucidation in FIG. 5. A period is divided up into the ranges I, II, III and IV for that. The statements made with regard to the first embodiment apply here.

The control device 7 can be a control device 7 that adds a constant to the reference sine wave, so on the one hand, there is an exact phase position and offset between the voltage at the output of the positive voltage multiplier 13 and the positive half-oscillation of the load voltage during the positive half-oscillation of the load voltage; an asynchronous and unregulated negative DC voltage is simultaneously generated by the negative voltage multiplier 14, and on the other hand, there is an exact phase position and offset between the voltage at the output of the negative voltage multiplier 14 and the negative half-oscillation of the load voltage during the negative half-oscillation of the load voltage; an asynchronous and unregulated positive DC voltage is simultaneously generated by the positive voltage multiplier 13.

The two reference potentials of the voltage multipliers 13, 14 that are connected to the another are connected via the measurement impedance 22 to the reference potential of the cable 4 as the test specimen; the reference potentials of the voltage multipliers 13, 14 and the reference potential of the voltage divider 5 are an auxiliary ground 23.

The voltage multipliers 13, 14 of the embodiments of the example are high-voltage cascades that can be designed in the form of a Greinacher circuit or in the form of a voltage multiplier derived from the Greinacher circuit with full-wave rectification without a smoothing column.

Furthermore, the protective resistor 6 is simultaneously a discharging resistor. The voltage sources 1 of the embodiments of the example are located in a shielded enclosure in each case, which is the auxiliary ground 23, when a device is involved. The connecting lead of the cable 4 is a shielded connecting lead; the shielding of the connecting lead is connected to the auxiliary ground 23. The enclosure, the current sources 2 and 3, the control device 7, the coupling diodes 8 and 9, the protective resistance 6 and the voltage divider 5 are arranged in a housing that is connected or that can be connected to the ground potential, so the device is a mobile device or the device is situated in a vehicle.

A potential-free, voltage-controlled current source to control high-voltage sources of the example can essentially be comprised of voltage-controlled transistors T1, T2 . . . TN with gate resistances RG1, RG2 . . . RGN, a control circuit 29, a resistor R and a zener diode ZD.

In the case of a series circuit with an arbitrary number of voltage-controlled transistors T1, T2 . . . TN, a voltage V of up to several 100 kV can exist in accordance with the blocking capability of the transistors T1, T2 . . . TN. This voltage V can also be described as the lead-in voltage. The voltage-controlled transistors T1, T2 . . . TN are, as an example, well-known MOSFETs (metal-oxide-semiconductor field-effect transistors) or IGBTs (insulated-gate bipolar transistors). The voltage for driving the transistors T1, T2 . . . TN is provided and balanced with the aid of the gate resistances RG1, RG2 . . . RGN connected to the gates, so this can be referred to as a gate-voltage balancing system. The current i_Gate through the gate resistances RG1, RG2 . . . RGN follows according to Ohm's law. The leakage currents in the gates of the transistors T1, T2 . . . TN are negligibly small. The gate of the lowest transistor T1 is driven with the aid of the control circuit 29. The gates of all of the transistors T2 . . . TN beyond that will then also be driven through the gate resistances RG1, RG2 . . . RGN of the gate-voltage balancing system. Gate driving means here that the gate-source voltage in the case of the MOSFET or the gate-emitter voltage in the case of the IGBT is set at the precise amplitude to obtain the desired current i. The transistors T1, T2 . . . TN have to necessarily always operate in a linear fashion for this type of current source.

The series circuit of the voltage-controlled transistors T1, T2 . . . TN and the resistor R are connected in series between the potentials V, 35. The zener diode ZD is connected between the transistors T1, T2 . . . TN in series and the resistor R. The free connector of the resistor R is a potential and the low end of the potential-free, voltage-controlled current source here. The voltage existing across the zener diode ZD or the voltage existing across the resistor R and the zener diode ZD is the supply voltage V+ of the control circuit 29. The resistances are ohmic resistances. To this end, the control circuit 29 has an optical receiver 30 for a fiber-optic cable 34 that converts the light from the regulator for the output voltage of the potential-free, voltage-controlled current source into an electrical signal, a demodulator 31, which converts the electrical signal into the required target voltage u_Targ for the non-inverting input of an operational amplifier 32, the operational amplifier 32 for generating the required gate control and a level adapter 33 to activate the voltage-controlled transistor T1 connected to the zener diode ZD as the first voltage-controlled transistor T1 connected in series.

Figure 7:
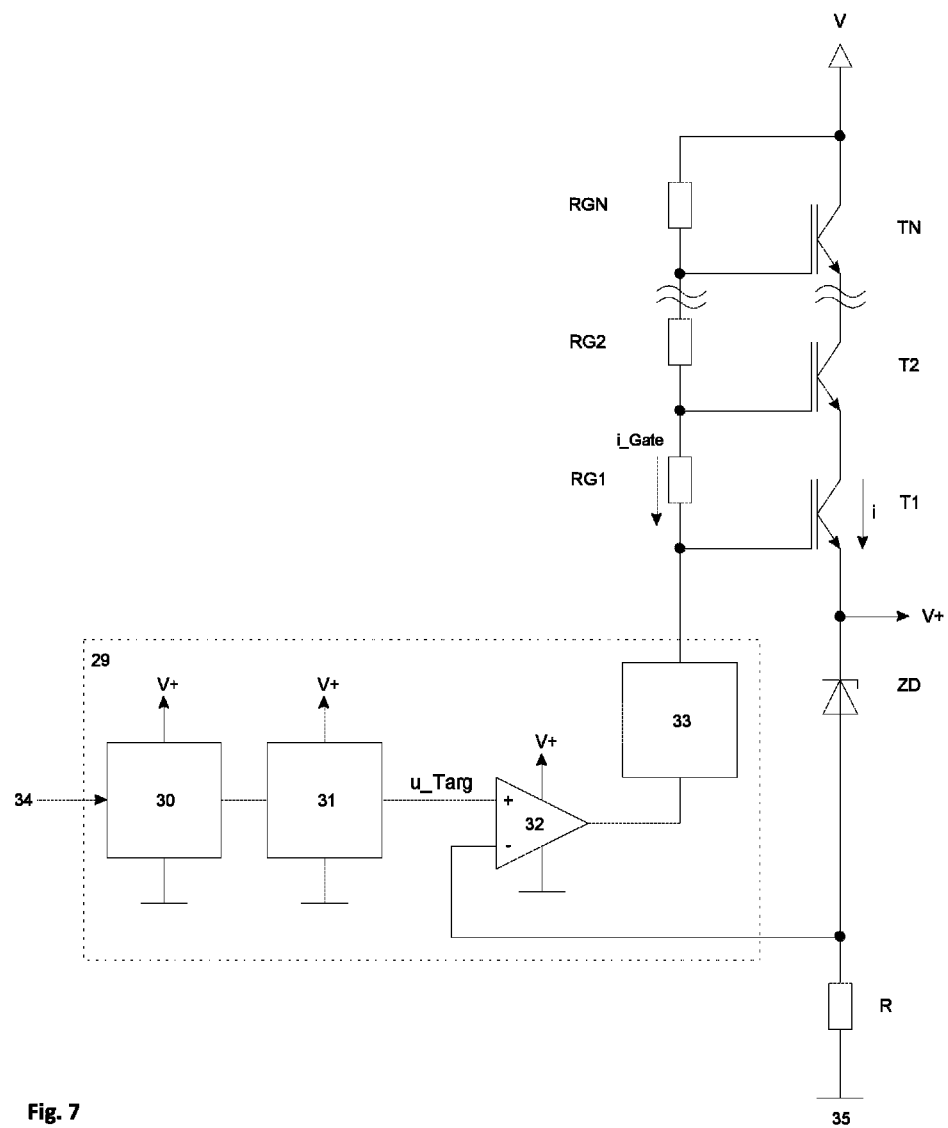
FIG. 7 shows a potential-free, voltage-controlled current source for controlling high-voltage sources.

FIG. 7 shows a voltage-controlled current source for controlling high-voltage sources in a basic diagram.

In a first embodiment of the potential-free, voltage-controlled current source is the inverting input of the operational amplifier 32 interconnected with the connection of the resistor R and the zener diode ZD. The current for supplying the control circuit 29 therefore flows past the resistor R and, in addition, at the target value specification. The low end 35 of the current source is simultaneously the reference potential of the control circuit 29.

Figure 8:
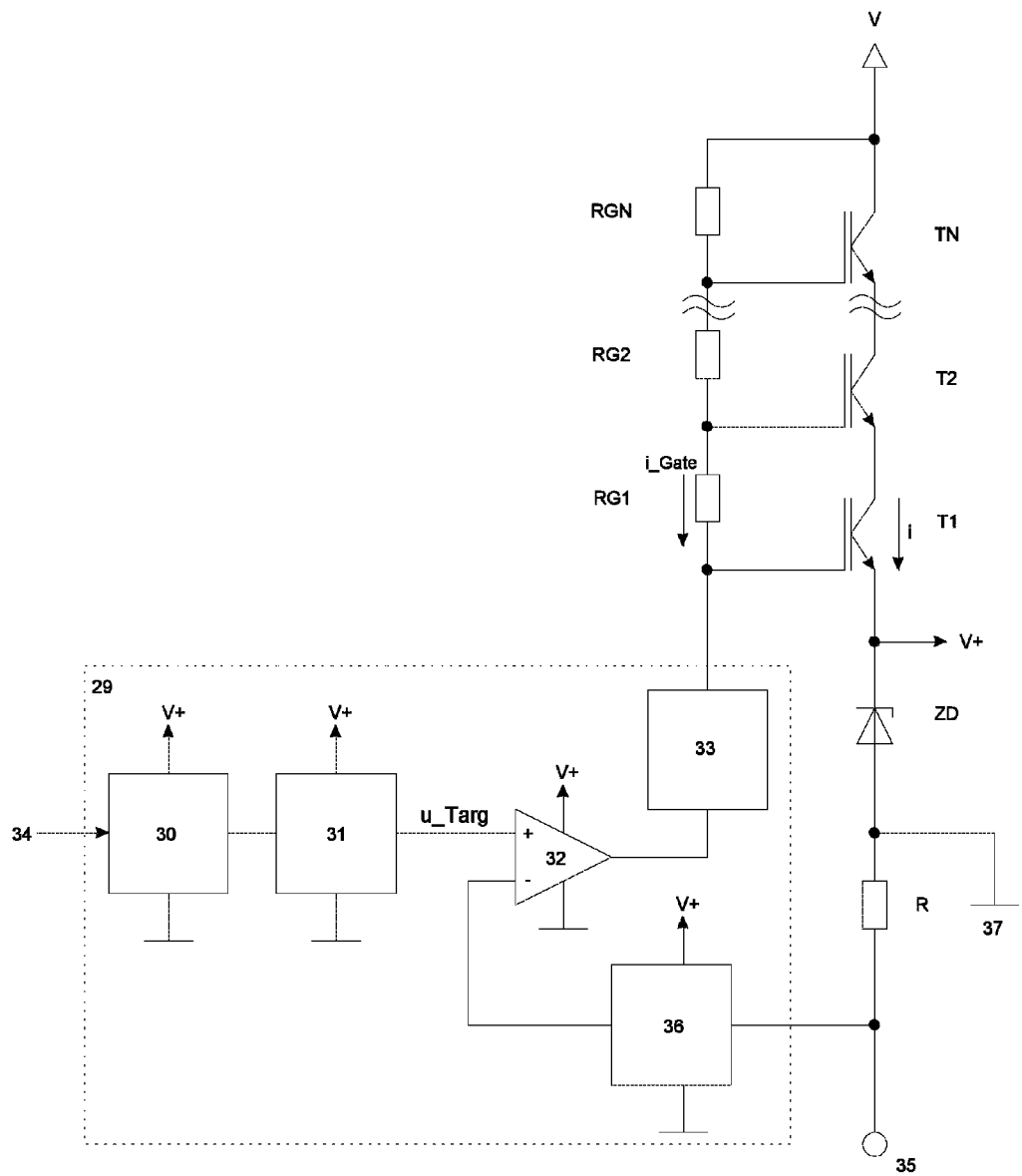
FIG. 8 shows a potential-free, voltage-controlled current source for controlling high-voltage sources; the current to supply the control circuit is part of the specified target value.

FIG. 8 shows a voltage-controlled current source for controlling high-voltage sources in a basic diagram; the current for supplying the control circuit 29 is a component of the specified target value.

In a second embodiment of the potential-free, voltage-controlled current source, the inverting input of the operational amplifier 32 is interconnected via an inverting amplifier 36, as a further component of the control circuit 29, to the low end 35 of the current source. The connection of the resistor R and the zener diode ZD is the reference potential 37 of the control circuit 29, so the current for supplying the control circuit 29 is routed through the resistor R. The current for supplying the control circuit 29 is therefore a component of the specified target value.

Figure 9:
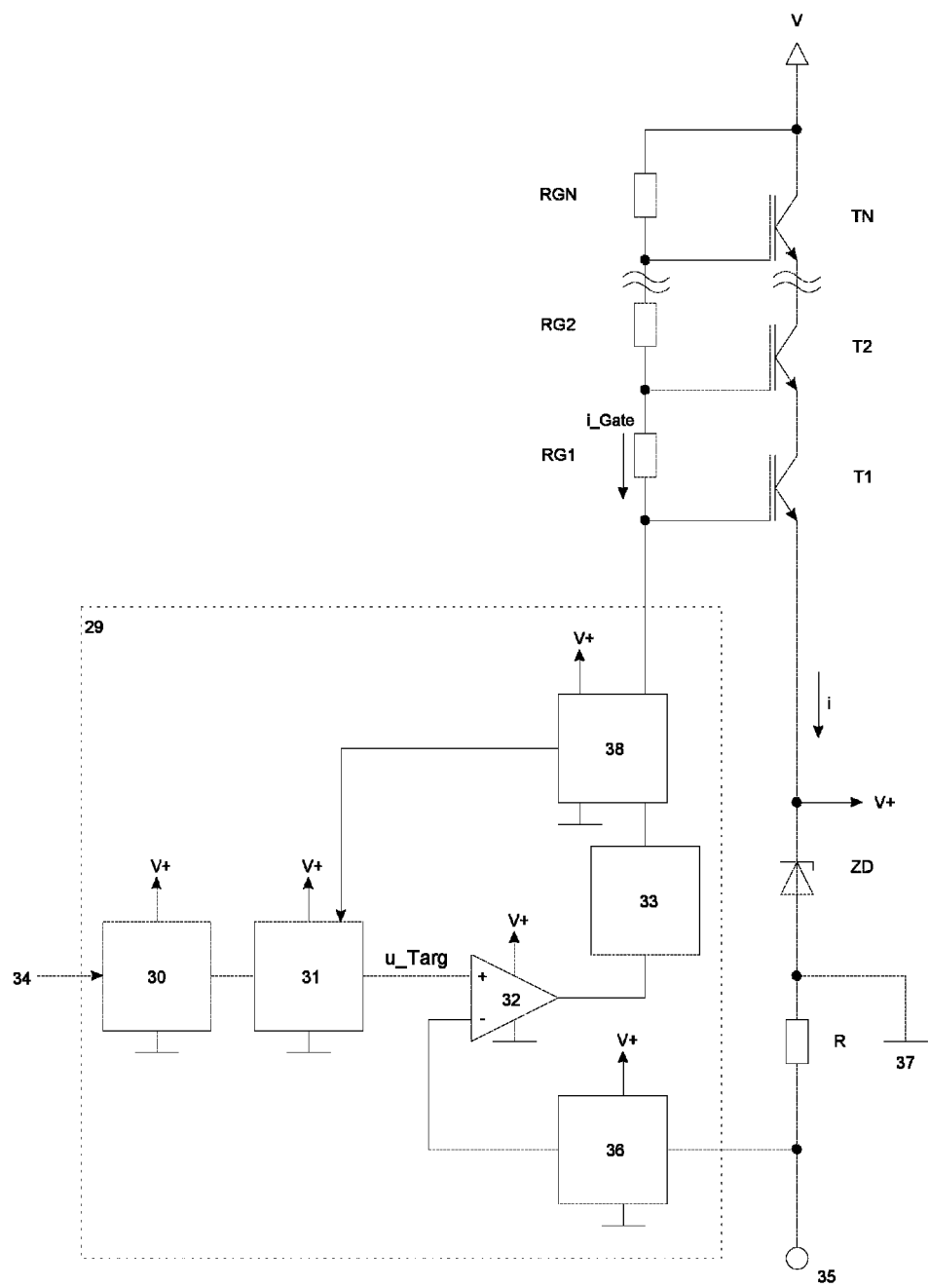
FIG. 9 shows a potential-free, voltage-controlled current source with a device for monitoring the current in the gate resistances of the transistors.

FIG. 9 shows a potential-free, voltage-controlled current source with a device 38 for monitoring the current in the gate resistances RG1, RG2 . . . RGN of the transistors T1, T2 . . . TN in a basic diagram.

In a third embodiment of the potential-free, voltage-controlled current source, the inverting input of the operational amplifier 32 is connected via an inverting amplifier 36, as a further component of the control circuit 29, to the low end 35 of the current source. The connection of the resistor R and the zener diode ZD is the reference potential 37 of the control circuit 29, so the current for supplying the control circuit 29 is routed through the resistor R. The current for supplying the control circuit 29 is therefore a component of the specified target value. The output of the operational amplifier 32 is connected through the level adapter 33 and a device 38 for monitoring the current in the gate resistances RG1, RG2 . . . RGN of the transistors T1, T2 . . . TN and therefore the gate-voltage balancing system. This device 38, as a further component of the control circuit 29, is connected to the demodulator 31, so a back-connection exists to the lead-in voltage of the current source.

A suppressor diode or a linear voltage regulator can be used in other embodiments of the potential-free, voltage controlled current sources instead of the zener diode ZD. The transistors T1, T2 . . . TN are protected from electromagnetic influences in a well-known way. To this end, they are provided with protective elements, for instance suppressor diodes, as surge arrestors.

Two potential-free, voltage-controlled current sources can be interconnected for a high-voltage source 1 with a positive and a negative high voltage. A first series circuit made up of the resistor R and the voltage-controlled transistors T1, T2 . . . TN connected in series is connected between a reference potential for a load and the positive high voltage. The second series circuit made up of the resistor R and the voltage-controlled transistors T1, T2 . . . TN connected in series is connected between the negative high voltage and the reference potential for the load. The reference potential of the load here is the connection between the resistor of the first series circuit and the last voltage-controlled transistor TN of the second series circuit. Continuing, two current-source arrangements of that type made up of two potential-free, voltage controlled current sources connected to one another can be arranged in parallel and connected to the high-voltage source 1 as a parallel circuit for a potential-free high-voltage source 1. The cable 4 is connected between the reference potentials of the current sources that are connected to one another here.

The voltage divider 5 of the example, and therefore of the embodiments, can be a high-voltage measuring divider 39. A device of that type is essentially comprised of plate-type component supports in the form of circuit boards 40 with resistors R and capacitors C, as well as field-control elements 41.

Figure 10:
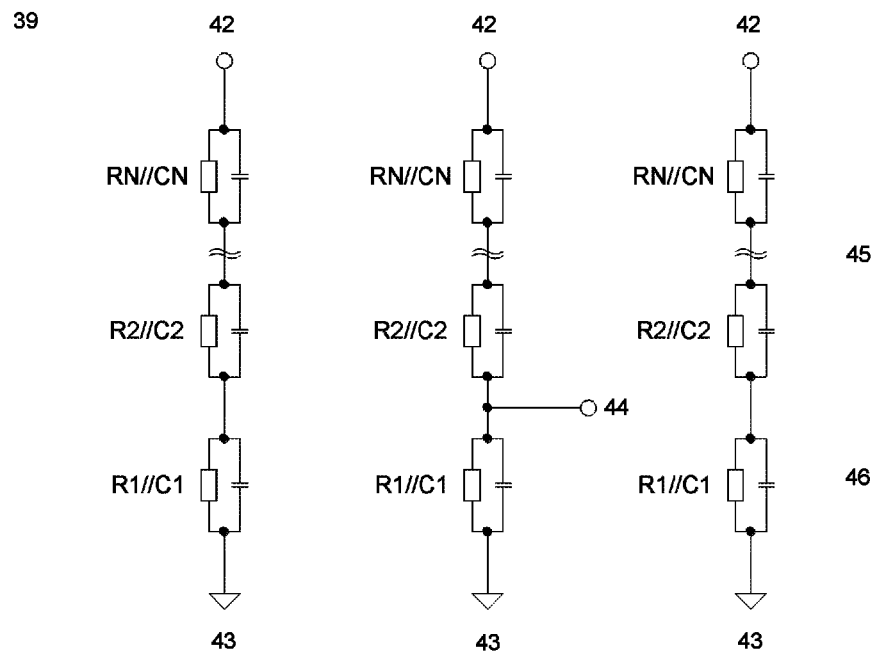
FIG. 10 shows a circuit diagram of a high-voltage measuring divider.

FIG. 10 shows a circuit diagram of a high-voltage measuring divider 39 in a basic diagram.

The high-voltage measuring divider is essentially comprised of a first branch with first parallel circuits 45 made up in each case of an ohmic resistor R2 to RN and a capacitor C2 to CN in a series circuit, a second branch with a second parallel circuit 46 made up of an ohmic resistor R1 and at least one capacitor C1 in series with first parallel circuits 45 made up in each case of an ohmic resistor R2 to RN and a capacitor C2 to CN and a third branch with first parallel circuits 45 made up in each case of an ohmic resistor R2 to RN and a capacitor C2 to CN in a series circuit. The branches are connected in parallel with one another and have connectors 42, 43. The connection between the first parallel circuits 45 and the second parallel circuit 46 of the second branch is the tap point 44 of the high-voltage measuring divider 39.

Figure 11:
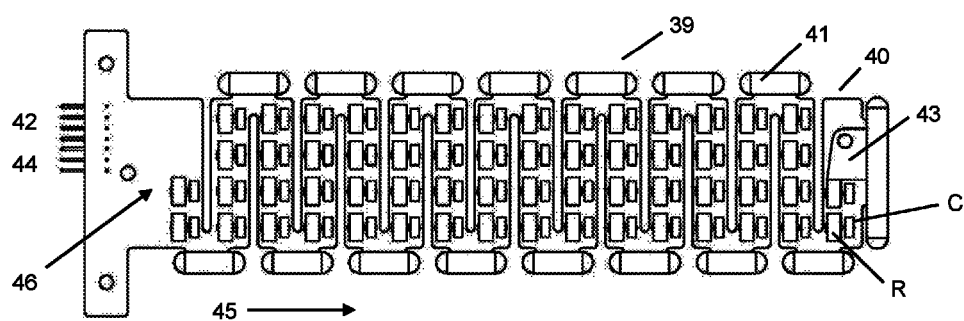
FIG. 11 shows a component support with resistors and capacitors as voltage dividers in a top view.

FIG. 11 shows a circuit board 40 with resistors R and capacitors C as a voltage divider in a basic diagram.

Figure 12:
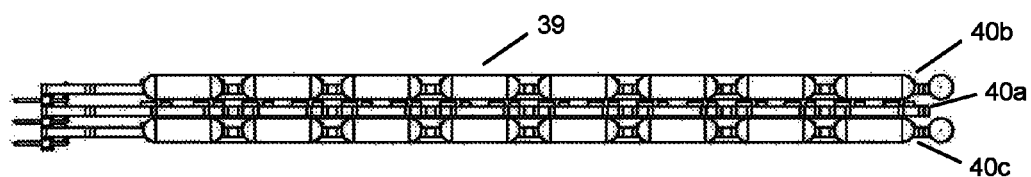
FIG. 12 shows a high-voltage measuring divider in a side view and FIG. 13 shows a field-control element on a circuit board.

The circuit board 40 has a meandering shape, so the first parallel circuits 45 made up in each case of an ohmic resistor R and a capacitor C are arranged in a meandering fashion on the circuit board 40. The resistors R and the capacitors C are interconnected with the conductor paths of the circuit board. The plate-type component supports with a meandering design are therefore well-known circuit boards 40 with conductor paths and contact points. The capacitors C and the resistors R are located on the circuit boards 40 in the form of components that can be surface mounted, connected in an electrically conducting way via well-known soldering processes to contact points and/or conductor paths of the circuit board 40. FIG. 12 shows a high-voltage measuring divider 39 in a basic side view.

Three circuit boards 40a, 40b, 40c equipped in this fashion are arranged one over the other.

Figure 13:
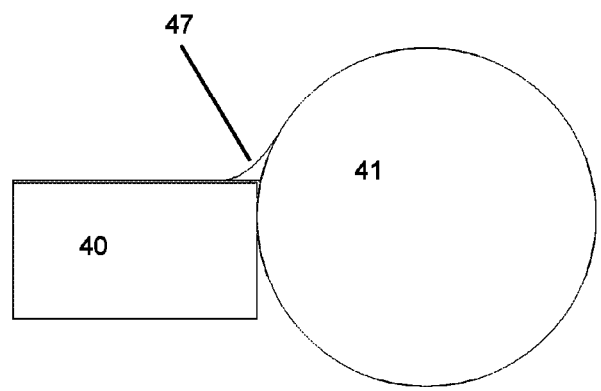

FIG. 13 shows a field-control element 41 on a circuit board 40 in a basic diagram. The field-control elements 41 are located on outward-pointing edges of at least one of the circuit boards 40 here that are on two circuit boards 40b, 40c. They are made up of cylindrical pieces comprised of an electrically conductive material with end areas designed in the form of spherical caps that are connected via soldering and therefore via solder 47 to conductor paths of the circuit board 40. The field-control elements 41 are made of a soft-solder material, for instance copper or brass, for that.

The cylindrical piece can have a groove to accommodate the end area of the circuit board 40.

The circuit boards 40 can be potted in a sealing compound except for the externally accessible connectors 42, 43, 44 that are spaced apart from one another. The circuit boards 40 are connected to one another with screw connections for that.

The two outer circuit boards 40b, 40c with the first and third branches are field-control components, and the circuit board 40a in the middle with the second branch is the measuring voltage divider.

The meandering shape ensures minimal space requirements. The parallel circuits 45, 46 can, of course, also be arranged in a straight line.

LIST OF REFERENCE NUMERALS

1 High-voltage source
2 Current source
3 Current source
4 Cable
5 Voltage divider
6 Protective resistor
7 Control device
8 Coupling diode
9 Coupling diode
10 Main converter
11 Auxiliary converter
12 Switching arrangement
13 Cascade for positive high voltage
14 Cascade for negative high voltage
15 Transformer of the auxiliary converter
16 DC/AC converter of the auxiliary converter
17 Voltage multiplier of the auxiliary converter
18 Rectifier
19 Device for generating AC voltage
20 Transformer of the main converter
21 Relay
22 Measurement impedance
23 Auxiliary ground
24 Voltage divider
25 Measurement recording unit
26 Intermediate circuit
27 Connection
28 Diode between the auxiliary converter and the cascade
29 Control circuit
30 Optical receiver
31 Demodulator
32 Operational amplifier
33 Level adapter
34 Fiber-optic cable
35 Potential of the current source
36 Inverting amplifier
37 Reference potential of the control circuit
38 Monitoring device
39 High-voltage measuring divider
40 Circuit board
41 Field-control element
42 Connector
43 Connector
44 Tap point
45 First parallel circuit
46 Second parallel circuit
47 Solder
i_Gate Current through the gate resistances
R Ohmic resistance
RG Gate resistance
T Voltage-controlled transistor
u_Targ Target voltage
V Potential
V+ Supply voltage of the control circuit
ZD Zener diode
C Capacitor

The invention claimed is:

1. A circuit arrangement for cable checking, cable testing, cable diagnosis and/or cable fault localization with
   a voltage source having a first voltage multiplier for a positive voltage and a second voltage multiplier for a negative voltage,
   current sources that are connected to one another in combination with the voltage multipliers to generate a test voltage over a load impedance of a cable to charge and discharge a load capacitance of the cable,
   a control device interconnected with the voltage source and the current sources, characterized in that
   the control device has a digital signal processor for regulating the test voltage over the load impedance of the cable measured via a voltage divider and for specifying a target value of the voltage source, and that the voltage multipliers are either connected to two main converters or are connected to both a main converter and an auxiliary converter generating a positive auxiliary voltage and a negative auxiliary voltage in such a way that either a positive voltage in accordance with the target-value specification and a constant, unregulated negative voltage, or a negative voltage in accordance with the target value specification and a constant, unregulated positive voltage, exist at the outputs of the voltage multipliers, wherein the respective unregulated voltage is either generated by the respective main converter or by the unregulated auxiliary converter and the voltage multipliers are interconnected to the current sources through a coupling diode in each case, so that a back-feed of the voltage multipliers is prevented, that the current sources connected with one another are connected via at least one protective resistor to the voltage divider and the cable, and that two reference potentials of the voltage multipliers connected with one another are connected via a measurement impedance adaptable to a measuring range to the reference potential of the cable, wherein the reference potentials of the voltage multipliers and the reference potential of the voltage divider are an auxiliary ground.

2. The circuit arrangement according to claim 1, characterized in that the control device is connected via a switching arrangement to the main converters in such a way that a voltage of one potential carried in accordance with the voltage of the digital signal processor exists at the voltage multiplier connected via the one main converter to the control device and that the other main converter that is not connected to the control device generates an unregulated voltage of the other potential, so a voltage always exist over the current sources.

3. The circuit arrangement according to claim 1, characterized in that the main converters are connected with one another in such a way that switches of the main converter switch with a synchronous frequency or with a synchronous frequency with phase-shifted switching points to reduce or eliminate beat effects and electrical interference.

4. The circuit arrangement according to claim 1, characterized in that the auxiliary converter, as a positive and negative high-voltage source, is comprised of a DC/AC converter connected to a transformer on the primary side and voltage multipliers connected on the secondary side for the positive and negative voltage.

5. The circuit arrangement according to claim 1, characterized in that the auxiliary converter is connected to the voltage multipliers and the main converter is connected via a switching arrangement to the voltage multipliers and that the main converter and the switching arrangement are interconnected with the control device in such a way that the voltage of the auxiliary converter and the voltage of the main converter that is carried in accordance with the voltage of the digital signal processor, of one potential each, exists at the voltage multiplier connected via the switching arrangement to the main converter, and that the other voltage multiplier is only connected to the auxiliary converter in such a way that an unregulated voltage of the other potential exists at this voltage multiplier.

6. The circuit arrangement according to claim 1, characterized in that the main converter is connected to the control device in such a way that the main converter is separated from the voltage multipliers during the zero crossing of the load voltage on the cable; the auxiliary converter therefore only autonomously generates the positive and the negative high voltage at the outputs of the voltage multipliers and, consequently, only the voltage of the auxiliary converter exists at the outputs of the voltage multipliers.

7. The circuit arrangement according to claim 1, characterized in that the digital signal processor is a digital sine-wave generator outputting a digital sine wave as a reference sine wave and that the control device adds a constant to the reference sine wave, so, on the one hand, there is an exact phase position and offset between the voltage at the output of the positive voltage multiplier and the positive half-oscillation of the load voltage during the positive half-oscillation of the load voltage, wherein an asynchronous and unregulated negative DC voltage is simultaneously generated by the auxiliary converter for the positive half-oscillation at the negative voltage multiplier, and, on the other hand, there is an exact phase position and offset between the voltage at the output of the negative voltage multiplier and the negative half-oscillation of the load voltage during the negative half-oscillation of the load voltage, wherein an asynchronous and unregulated positive DC voltage is simultaneously generated by the auxiliary converter for the negative half-oscillation at the positive voltage multiplier.

8. The circuit arrangement according to claim 1, characterized in that the digital signal processor is a digital sine-wave generator outputting a digital sine wave, that the control device polls the output voltages of the voltage multipliers of the voltage source and that calculates the new target values from the digital sine-wave generator and that the control device is a control device that regulates the voltage over the cable based on the new target value from the digital sine-wave generator.

9. The circuit arrangement according to claim 1, characterized in that the main converter is a main converter that converts the mains voltage, wherein a rectifier, a device to generate AC voltage with a full bridge or a half bridge and a resonant circuit for feeding a transformer and the transformer are connected one after the other for this.

10. The circuit arrangement according to claim 1, characterized in that the voltage multiplier is a high-voltage cascade in the form of a Greinacher circuit or in the form of a high-voltage cascade derived from a Greinacher circuit with full-wave rectification without a smoothing column.

11. The circuit arrangement according to claim 1, characterized in that the protective resistor is simultaneously a discharging resistor.

12. The circuit arrangement according to claim 1, characterized in that the current source is a potential-free, voltage controlled current source for controlling the high-voltage source 1 with a series circuit made up of a resistor and voltage-controlled transistors connected in series between the potentials and a control circuit connected to the voltage-controlled transistors with an optical receiver and an operational amplifier, that a zener diode, a suppressor diode or a linear voltage regulator is connected between the voltage-controlled transistors connected in series, that the free connector of the resistor is a potential of the potential-free, voltage-controlled current source and that either the voltage existing across the zener diode, the suppressor diode or the linear voltage regulator or the voltage existing across the resistor and the zener diode, the suppressor diode or the linear voltage regulator is the supply voltage of the control circuit.

13. The circuit arrangement according to claim 1, characterized in that the voltage divider is a high-voltage measuring divider, that first parallel circuits comprised in each case of an ohmic resistor and a capacitor are arranged in a series circuit on plate-type component supports and at least one second parallel circuit made up of an ohmic resistor and at least one capacitor is arranged on at least one of the component supports, that at least three component supports are arranged one on top of the other, that at least one component support has field-control elements on edges pointing outwards, that the field-control elements are comprised of cylindrical or tube-shaped pieces made of an electrically conductive material with end areas designed in the form of spherical caps and that the outer component supports having at least the first parallel circuits are field-control components, and the component support in the middle with the first parallel circuits and the second parallel circuit are the measuring voltage divider, wherein the connection between the first parallel circuits and the second parallel circuit of the measuring voltage divider is the tap point of the high-voltage measuring divider, and the first parallel circuits of the field-control components and the series circuit comprised of the first parallel circuits and the second parallel circuit of the measuring voltage divider, connected in parallel with one another, are the further connectors of the high-voltage measuring divider.

14. A device for cable checking, cable testing, cable diagnosis and/or cable fault localization with a circuit arrangement according to claim 1, characterized in that the voltage source is in a shielded enclosure, wherein the enclosure is the auxiliary ground, and that the connecting lead of the cable is a shielded connecting lead, wherein the shielding of the connecting lead is connected to the auxiliary ground or that the connecting lead of the cable is a shielded connecting lead with two separate shields, wherein the inner shield is the auxiliary ground and the external shield is connected to the ground potential.

15. The device according to claim 14, characterized in that the enclosure, the current sources, the control device, the coupling diodes, the protective resistor and the voltage divider are arranged in a housing that is connected or that can be connected to the ground potential, so the device is a mobile device or the device is situated in a vehicle.

* * * * *